(12) United States Patent
Ushiro et al.

(10) Patent No.: US 11,664,802 B2
(45) Date of Patent: May 30, 2023

(54) PROXIMITY SENSOR

(71) Applicant: OMRON Corporation, Kyoto (JP)

(72) Inventors: Yuki Ushiro, Ayabe (JP); Daisuke Inoue, Ayabe (JP); Yusuke Nakayama, Kameoka (JP); Hiroto Katsura, Fukuchiyama (JP)

(73) Assignee: OMRON Corporation, Kyoto (JP)

( * ) Notice: Subject to any disclaimer, the term of this patent is extended or adjusted under 35 U.S.C. 154(b) by 10 days.

(21) Appl. No.: 17/439,817

(22) PCT Filed: Mar. 9, 2020

(86) PCT No.: PCT/JP2020/009903
§ 371 (c)(1),
(2) Date: Sep. 16, 2021

(87) PCT Pub. No.: WO2020/208986
PCT Pub. Date: Oct. 15, 2020

(65) Prior Publication Data
US 2022/0094359 A1    Mar. 24, 2022

(30) Foreign Application Priority Data
Apr. 10, 2019  (JP) .............................. JP2019-075086

(51) Int. Cl.
*H03K 17/95* (2006.01)
(52) U.S. Cl.
CPC ....... *H03K 17/952* (2013.01); *H03K 17/9505* (2013.01); *H03K 2217/945* (2013.01)
(58) Field of Classification Search
CPC .......... H03K 17/952; H03K 17/9505
(Continued)

(56) References Cited

U.S. PATENT DOCUMENTS 6,025,562 A * 2/2000 Shimizu .................. G01V 3/10
174/521
2011/0001550 A1   1/2011 Schoen

FOREIGN PATENT DOCUMENTS

EP          1879294         1/2008
JP          05-015275   *   2/1993
(Continued)

OTHER PUBLICATIONS

"International Search Report (Form PCT/ISA/210) of PCT/JP2020/009903," dated Jun. 2, 2020, with English translation thereof, pp. 1-4.

(Continued)

*Primary Examiner* — Tomi Skibinski
(74) *Attorney, Agent, or Firm* — JCIPRNET

(57) ABSTRACT

Provided is a proximity sensor that can limit degradation in voltage resistance. A proximity sensor includes: a housing; a coil portion that is accommodated in one end of the housing; a clamp portion that is connected to the other end of the housing; a substrate which is accommodated inside the housing and the clamp portion, and on which a circuit electrically connected to the coil portion is mounted; a shield that covers a part of the substrate located on a side of the housing; and a resin portion which is arranged inside the housing and the clamp portion, and covers at least a part of the substrate. The shield has an extension portion which extends to an inside of the clamp portion and covers at least a part of the circuit located inside the clamp portion.

4 Claims, 5 Drawing Sheets

(58) Field of Classification Search
USPC .................................................. 324/207.16
See application file for complete search history.

(56) References Cited

FOREIGN PATENT DOCUMENTS

| | | |
|---|---|---|
| JP | H0515275 | 2/1993 |
| JP | H0992105 | 4/1997 |
| JP | 2000208013 | 7/2000 |
| JP | 2009048902 | 3/2009 |

OTHER PUBLICATIONS

"Written Opinion of the International Searching Authority (Form PCT/ISA/237) of PCT/JP2020/009903," dated Jun. 2, 2020, with English translation thereof, pp. 1-6.
"Search Report of Europe Counterpart Application", dated Nov. 11, 2022, pp. 1-8.

* cited by examiner

PROXIMITY SENSOR

CROSS-REFERENCE TO RELATED APPLICATION

This application is a 371 application of the international PCT application serial no. PCT/JP2020/009903, filed on Mar. 9, 2020, which claims the priority benefits of Japan application no. 2019-075086, filed on Apr. 10, 2019. The entirety of each of the above-mentioned patent applications is hereby incorporated by reference herein and made a part of this specification.

BACKGROUND

Technical Field

The present invention relates to a proximity sensor.

Related Art

A proximity sensor is known as one of the sensors for detecting the presence/absence or the position of a metal body that is taken as an object to be detected. The proximity sensor is Widely used mainly in various manufacturing facilities, industrial robots, and the like.

The proximity sensor mainly includes a tubular housing, a coil portion including a core and a coil, and a substrate on Which a circuit electrically connected to the coil is arranged. The housing has a case main body Which accommodates the coil portion arranged at the front end thereof, and a clamp Which is connected to the back side of the case main body and holds a cable connected to the substrate. The substrate With the circuit mounted thereon is located on the back side of the coil portion inside the housing, and is arranged extending to the inside of the clamp.

In the proximity sensor having the above configuration, it is necessary to arrange an electrostatic shield in order to make the coil and the circuit not be affected by the electromagnetic wave from the outside. When a configuration Without an electrostatic shield is used, a noise is superimposed on the electric signal flowing through the coil and the circuit, and as a result, an operation failure of the proximity sensor such as an erroneous operation is caused.

For example, Patent literature 1 discloses the proximity sensor equipped with an electrostatic shield. Patent literature 1 describes an electrostatic shield having, in order to prevent the entry of a noise from the outside, a first tubular shield portion that is formed in a tubular shape so as to cover the surrounding of the coil portion, and a second tubular shield portion that is formed in a tubular shape so as to cover a portion of the substrate arranged inside the housing, the portion being located on the case main body side.

LITERATURE OF RELATED ART

Patent Literature

Patent literature 1: Japanese Patent Laid-Open No. 2009-048902

SUMMARY

Problems to be Solved

Meanwhile, in the proximity sensor, the coil portion and the substrate are generally sealed by a resin for the purpose of preventing moisture, oil, and the like from entering the space inside the housing from the outside. When a resin is filled inside the housing of the proximity sensor equipped with an electrostatic shield as described in Patent literature 1, for example, a portion of the substrate which is not covered by the electrostatic shield (in other words, a portion located on the clamp side in the circuit mounted on the substrate) is sealed by the resin. However, bubbles may be generated in the resin filled inside the housing depending on the filling method, viscosity, and the like of the resin, and there is a problem that voltage resistance is degraded due to the influence of the bubbles.

Thus, the present invention aims to provide a proximity sensor that can suppress degradation in voltage resistance.

Means to Solve Problems

A proximity sensor according to one aspect of the present invention includes: a housing; a coil portion that is accommodated in one end of the housing; a clamp portion that is connected to the other end of the housing; a substrate which is accommodated inside the housing and the clamp portion, and on which a circuit electrically connected to the coil portion is arranged; a shield that covers a part of the substrate located on a side of the housing; and a resin portion which is arranged inside the housing and the clamp portion, and covers at least a part of the substrate. The shield has an extension portion which extends to an inside of the clamp portion and covers at least a part of the circuit located inside the clamp portion.

According to the aspect, even when bubbles are generated inside the resin filled inside the housing, the degradation in voltage resistance can be suppressed because the shield has the extension portion which covers at least a part of the circuit located inside the clamp.

In the above aspect, an inner diameter of the clamp portion may be smaller than an inner diameter of the housing. The extension portion may have a plate shape extending along a surface direction of the substrate, and a dimension in a width direction of the extension portion may be smaller than the inner diameter of the clamp portion.

According to the aspect, even when the configuration is used in which the inner diameter of the clamp is smaller than the inner diameter of the housing, the extension portion can be arranged extending to the inside on the clamp side because the shield has the extension portion having a plate shape whose dimension in the width direction is smaller than the inner diameter of the clamp portion.

In the above aspect, the extension portion may extend to a position that covers a part of the circuit on a side of the clamp portion.

According to the aspect, because the extension portion of the shield extends to the position that covers the part of the circuit on the side of the clamp portion, degradation in voltage resistance due to the bubbles generated inside the resin can be further suppressed.

In the above aspect, the shield may include a shield main body portion which covers a part of the substrate located on the side of the housing, and the extension portion. The shield main body portion may have a cross-section in a substantially elliptical shape having a minor diameter smaller than an inner diameter of the clamp portion, and include a pair of side surface portions extending along a surface direction of the substrate, and a connection portion which connects the pair of side surface portions. The side surface portion may be arranged on a side of a minor axis of the substantially elliptical shape. The extension portion may be a portion that extends from an end of the side surface portion to the inside of the clamp portion along the surface direction of the substrate.

According to the aspect, the shield main body portion has a substantially elliptical cross-section having a minor diameter smaller than the inner diameter of the clamp portion, and the extension portion is arranged on the side surface portion arranged on the minor axis side of the substantially elliptical shape. Thus, even if the configuration is used in which the inner diameter of the clamp is smaller than the inner diameter of the housing, the extension portion can be easily extended to the inside of the clamp.

Effect

According to the present invention, a proximity sensor that can suppress degradation in voltage resistance can be provided.

DESCRIPTION OF THE EMBODIMENTS

Preferred embodiments of the present invention are described with reference to the accompanying drawings. It should be noted that in each diagram, those marked with the same signs have the same or similar configurations.

Figure 1:
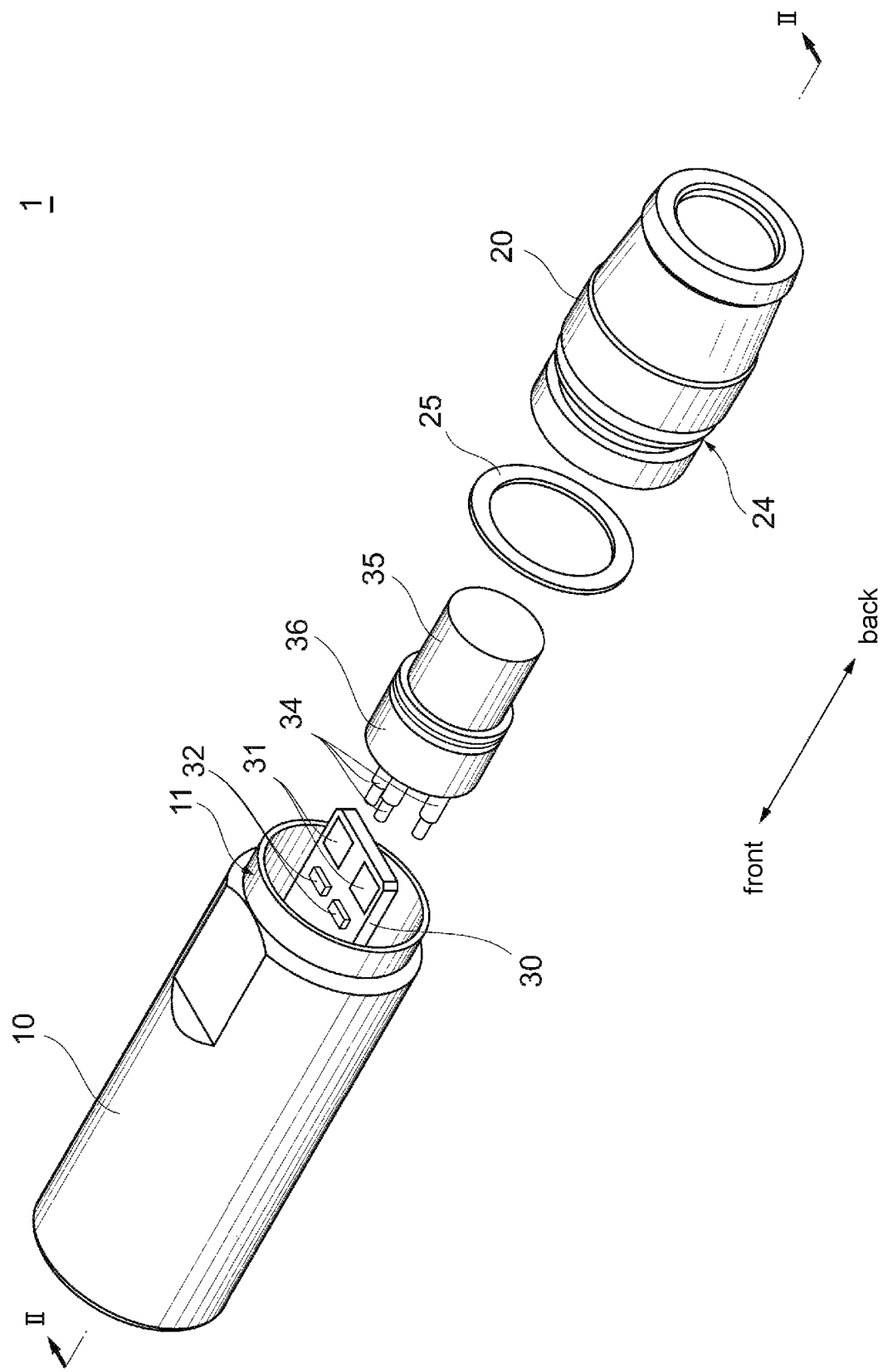
FIG. 1 is an exploded perspective view showing a sensor according to an embodiment.
Figure 2:
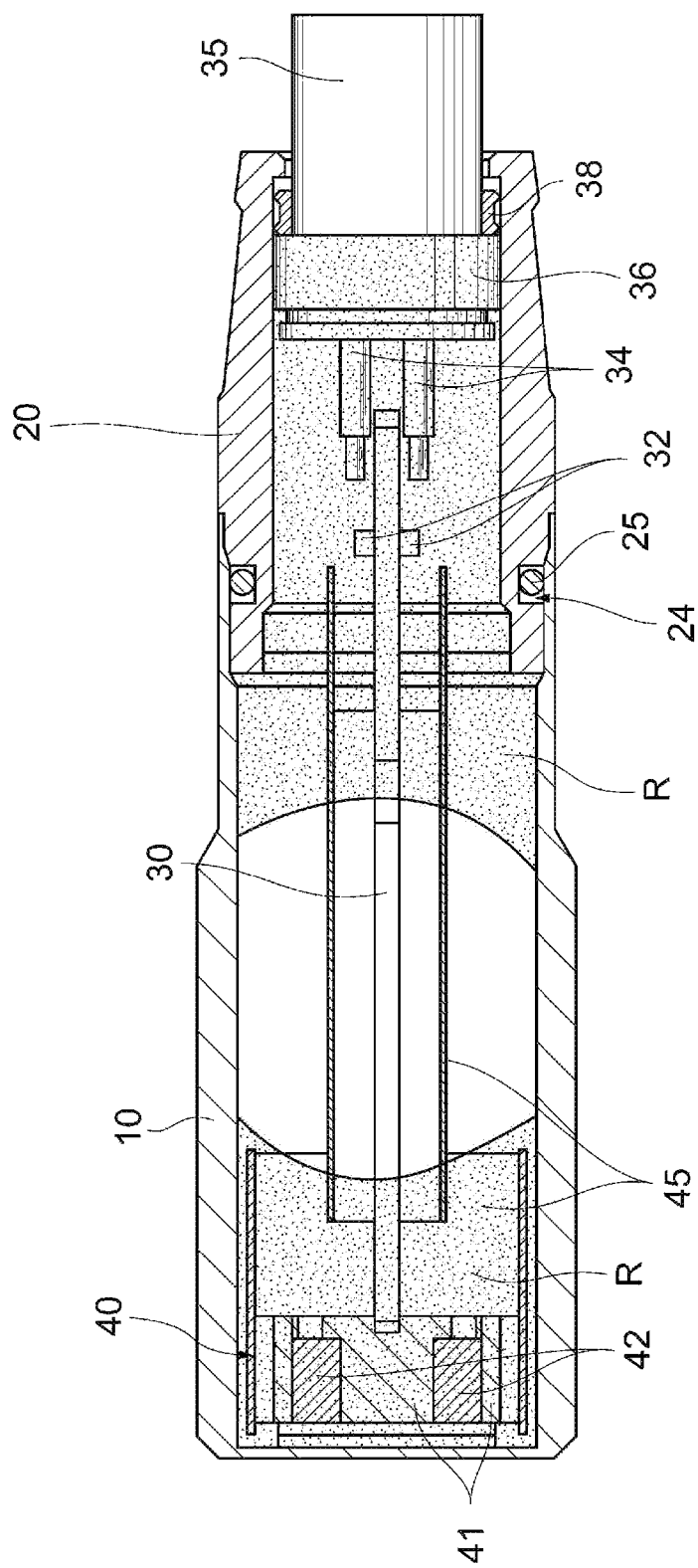
FIG. 2 is a cross-sectional view taken along a II-II line in a state that the sensor shown in FIG. 1 is assembled.

The internal structure of a sensor 1 is described with reference to FIGS. 1 and 2. FIG. 1 is an exploded perspective view of the sensor 1 according to the embodiment of the present invention. FIG. 2 is a cross-sectional view taken along a II-II line in a state that the sensor 1 shown in FIG. 1 is assembled.

The sensor 1 according to the embodiment is a proximity sensor which can detect in a non-contact manner that an object to be detected approaches, and includes a housing 10, a clamp 20, an O-ring 25, a substrate 30, a cable wire 34, a cable 35, a ring component 36, a detection portion 40, and a shield 45. The housing 10 is formed in a tubular shape, and electronic components such as a substrate 30 and the like are accommodated therein. The housing 10 has an opening 11 at one end, and electronic components such as the substrate 30 and the like are inserted from the opening 11. The housing 10 may be formed by a metal, a resin, or the like. The outer shape of the sensor 1 is a cylindrical shape, and may also be a prismatic shape in which the outer circumference of the housing 10 or the clamp 20 has a polygonal shape.

The end of the clamp 20 is connected to the opening 11 of the housing 10 to protect the electronic components such as the substrate 30 and the like accommodated in the housing 10. When it is assumed as shown by an arrow in FIG. 1 that a direction from the clamp 20 toward the housing 10 is the front and a direction from the housing 10 toward the clamp 20 is the back along the axial direction of the sensor 1, the front portion of the clamp 20 is inserted into the housing 10 from the opening 11 as shown in FIG. 2. Most of the region of the substrate 30 is accommodated inside the housing 10, but the back region of the substrate 30 is accommodated inside the clamp 20. In addition, the cable wire 34, the ring component 36, and a portion of the cable 35 are accommodated in the clamp 20.

The clamp 20 has a tubular shape. The clamp 20 has a recess 24, and the O-ring 25 is attached to the recess 24. As shown in FIG. 2, the O-ring 25 is located inside the housing 10 in a state that the sensor 1 is assembled, and seals a gap between the inner wall of the housing 10 and the outer wall of the clamp 20.

Although the clamp 20 can be formed by a resin, a metal, or the like, it is preferable that the clamp 20 is formed by a transparent material that transmits visible light so that an indicator lamp 32 located inside the sensor 1 can be visually recognized from the outside.

The substrate 30 is a substrate on which a control circuit (not shown) for controlling the detection portion 40 and a current supply circuit (not shown) for supplying a current to the detection portion 40 are mounted, and a portion of the substrate 30 is accommodated in the housing 10. As shown in FIG. 2, the detection portion 40 is attached to the end of the substrate 30 on the front side. The detection portion 40 detects the presence/absence of the object to be detected in a non-contact manner. The detection portion 40 includes a core 41 in which a coil 42 is accommodated, and the coil 42 wound in an annular shape. On the other hand, a land 31 is arranged at the end of the substrate 30 on the back side, and is electrically connected to the cable wire 34. Here, a method of detecting the object to be detected by the sensor 1 is described. Firstly, an exciting current is supplied to the coil 42 from the current supply circuit mounted on the substrate 30. The coil 42 generates a magnetic field based on the supplied exciting current. When the object to be detected such as a metal approaches the coil 42 in the state, an eddy current is generated inside the object to be detected according to the law of electromagnetic induction. The eddy current generates a magnetic field, and thus a magnetic flux penetrating the coil 42, and even the impedance of the coil 42 change. The control circuit connected to the detection portion 40 measures the change in the impedance of the coil 42 and detects the presence/absence of the object to be detected.

The indicator lamp 32 which indicates the operation state of the sensor 1 is mounted on the substrate 30. The indicator lamp 32 may be, for example, a LED or the like. In the embodiment, the indicator lamp 32 lights up when the power supply of the sensor 1 is turned on or when the sensor 1 detects the object to be detected.

The cable 35 applies a protective coating to a plurality of cable wires 34. The cable wires 34 are electrically connected to the land 31 of the substrate 30. The cable wires 34 may supply electric power from an external power supply to the circuit mounted on the substrate 30. In addition, the cable wires 34 may transmit an output signal from the control circuit mounted on the substrate 30 to an external apparatus such as an amplifier or the like.

The ring component 36 is arranged on the outer circumference of the cable 35 to prevent the damage of the cable 35. Specifically, the ring component 36 is formed by injection molding or the like in a position that covers the end of the protective coating on the cable 35. In addition, the ring component 36 is in close contact with the sealing resin filled inside the housing 10, and fixes the cable 35 to the clamp 20.

A sealing ring 38 is arranged between the cable 35 and the clamp 20 and in a region behind the ring component 36 in a way of surrounding the cable 35. The sealing ring 38 seals the gap between the inner wall of the clamp 20 and the outer circumference of the cable 35. The sealing ring 38 prevents liquids and dust from entering from the outside of the sensor 1. In addition, the sealing ring 38 prevents a sealing resin R (FIGS. 2 and 3) filled inside the sensor 1 from leaking to the outside.

The shield 45 eliminates a noise from the outside. The shield 45 is arranged in a way of surrounding the detection portion 40 and a portion of the substrate 30 to prevent a noise from reaching the detection portion 40 and the substrate 30. The shield 45 may be formed by, for example, a metal film or a laminated member of a copper foil and a polyimide resin.

Figure 3:
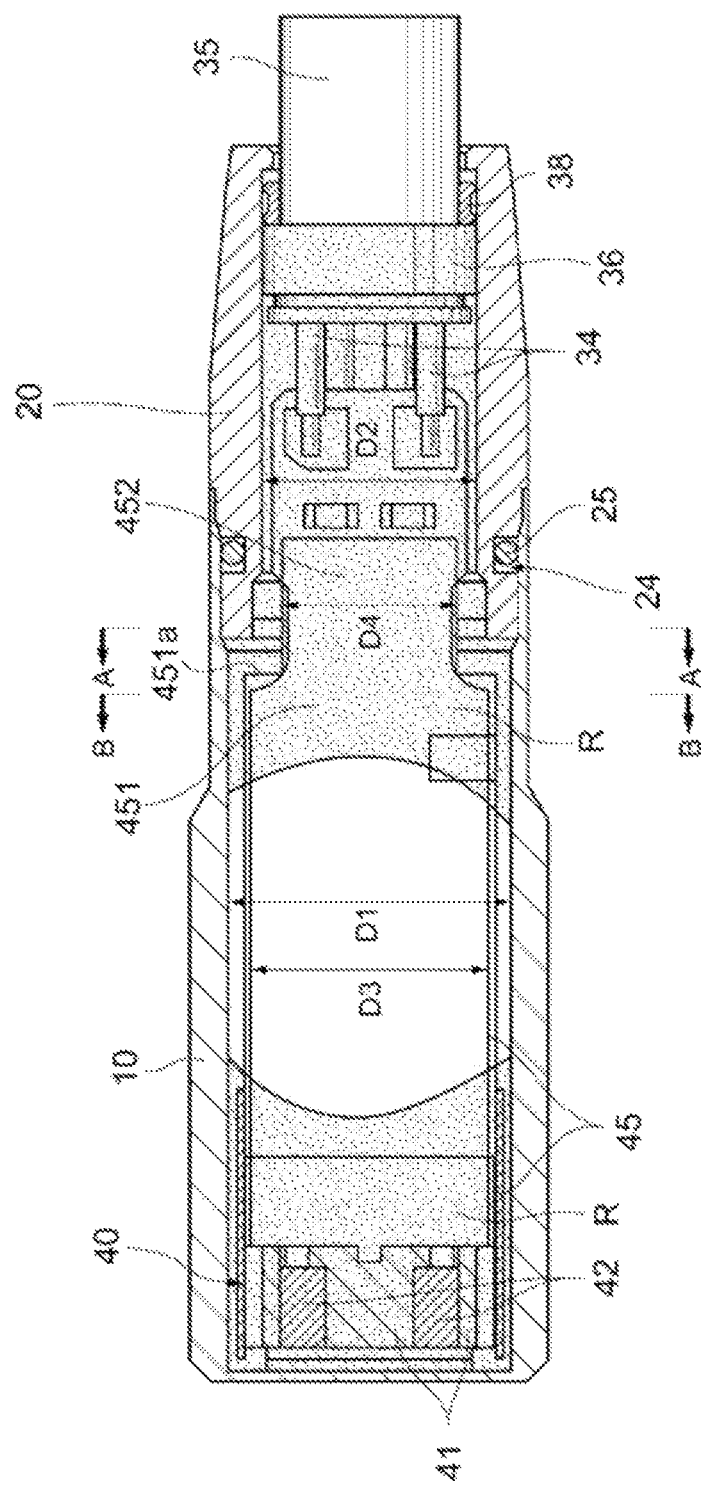
FIG. 3 is an explanatory diagram showing the configuration inside the sensor in a state that the sensor shown in FIG. 1 is assembled.
Figure 4:
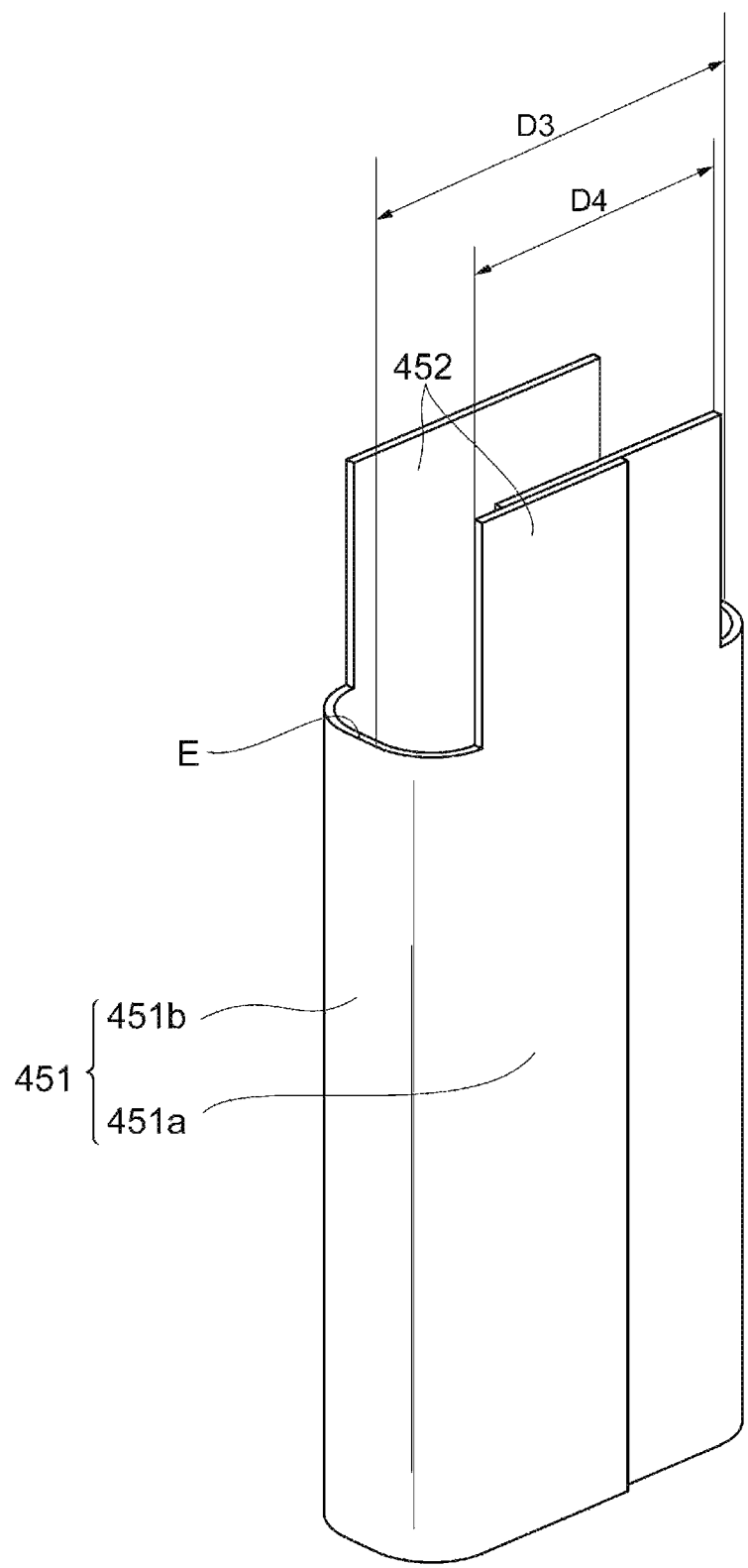
FIG. 4 is a perspective view showing the configuration of a shield in the sensor shown in FIG. 1.
Figure 5:
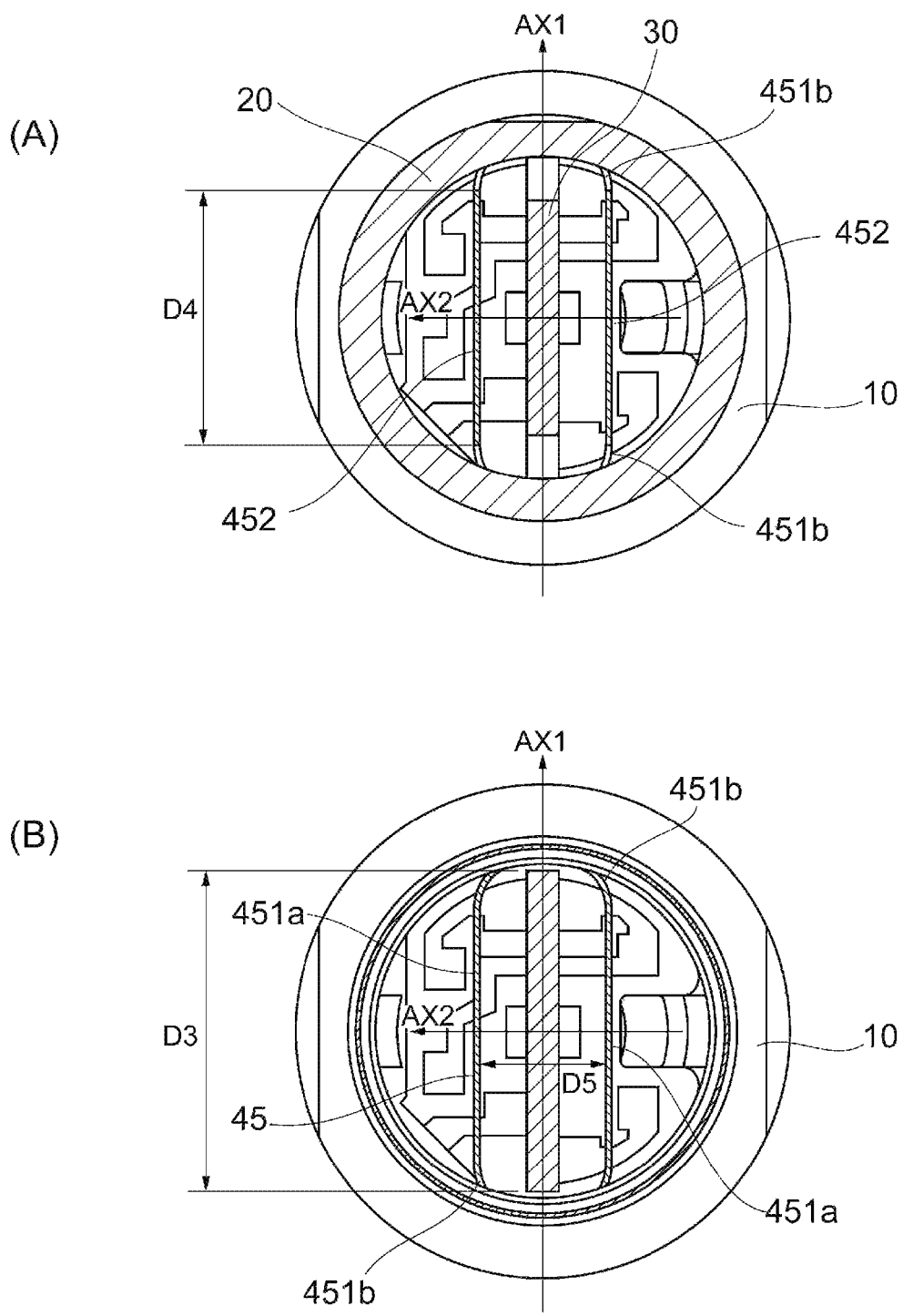
In FIG. 5, (A) is a cross-sectional view showing a cross-section taken along an A-A line shown in FIG. 3, and (B) is a cross-sectional view showing a cross-section taken along a B-B line shown in FIG. 3.

The configuration of a portion of the shield 45 which is arranged in a way of surrounding a part of the substrate 30 is described. Hereinafter, the portion of the shield 45 which is arranged in a way of surrounding a portion of the substrate 30 is referred to as a shield main body portion 451. FIG. 4 is a perspective view showing the configuration of the shield main body portion 451 and an extension portion 452. In FIG. 5, (A) is a cross-sectional view showing a cross-section taken along an A-A line shown in FIG. 3. In FIG. 5, (B) is a cross-sectional view showing a cross-section taken along a B-B line shown in FIG. 3.

As shown in FIG. 4 and (A) of FIG. 5, the shield main body portion 451 has a substantially elliptical shape in a cross-sectional view which is formed by a pair of side surface portions 451a and a connection surface portion 451b that connects the pair of side surface portions 451a in an arc shape.

The pair of side surface portions 451a has a substantially flat plate shape in the embodiment. The pair of side surface portions 451a is arranged extending along the surface direction of the substrate 30 in a state that the sensor is assembled. A pair of the extension portions 452 is connected to one end side of the pair of side surface portions 451a (a portion of the side surface portion 451a on the clamp 20 side).

The extension portion 452 is a portion protruding from an end E of the shield main body portion 451 toward the clamp 20 side, and is arranged in a way of extending along the longitudinal direction of the pair of side surface portions 451a. As shown in FIGS. 2 and 3, the extension portion 452 extends to the inside of the clamp 20, and covers at least a portion of the circuit which is located on the clamp 20 side in the circuit mounted on the substrate 30. In this way, the shield 45 has the extension portion 452 that covers at least a portion of the circuit located inside the clamp 20, and thus even when bubbles are generated in the resin filled inside, degradation in voltage resistance due to the bubbles generated inside the resin can be suppressed. Preferably, the extension portion 452 extends along the surface direction of the substrate 30 to a position which covers the circuit located on the clamp 20 side in the circuit mounted on the substrate 30. For example, the extension portion 452 extends along the surface direction of the substrate 30 so as to extend to the vicinity of the indicator lamp 32 (a portion that does not abut against the indicator lamp 32) mounted on the substrate 30.

In the embodiment, the surface side of the part of the substrate 30 which is located on the clamp 20 side is protected by the extension portion 452, and the side-surface side of the part of the substrate 30 which is located on the clamp 20 side (a portion which is located closer to the outer circumference side than the extension portion 452 inside the clamp 20) is protected by the sealing resin R (FIG. 3) filled inside the sensor 1. The extension portion 452 of the shield 45 is located on a circuit component mounted on the surface side of the part of the substrate 30 which is located on the clamp 20 side, and thereby noise resistance can be improved.

In addition, in the sensor 1 according to the embodiment, an inner diameter D2 (FIG. 3) of the clamp 20 is smaller than an inner diameter D1 of the housing 10. When the shield 45 is viewed from a direction orthogonal to the surface of the substrate 30 (see FIG. 3), a dimension D4 (FIG. 3, and (A) of FIG. 5) of the extension portion 452 in the width direction is smaller than a dimension D3 (FIG. 3, and (B) of FIG. 5) of the shield main body portion 451 in the width direction, and is smaller than the inner diameter D2 of the clamp 20. In the embodiment, when the shield 45 is viewed from the direction orthogonal to the surface of the substrate 30 (see FIG. 3), a shape is formed in which both sides of the extension portion 452 in the width direction are cut out with respect to the shield main body portion 451, and thereby the dimension D4 of the extension portion 452 in the width direction is made smaller than the dimension D3 of the shield main body portion 451 in the width direction.

As described above, the shield main body 451 has a substantially elliptical cross-section. Specifically, as shown in (B) of FIG. 5, the shield main body portion 451 (the side surface portion 451a and the connection surface portion 451b) has a substantially elliptical cross-section in which a direction along the width direction of the substrate 30 is taken as a long axis AX1 and the direction orthogonal to the surface of the substrate 30 is taken as a minor axis AX2. A minor diameter D5 ((B) of FIG. 5) of the substantially elliptical shape is smaller than the inner diameter D2 of the clamp 20, and the extension portion 452 ((A) of FIG. 5) is arranged on the minor axis AX2 side of the substantially elliptical shape. In this way, in the embodiment, the shield main body portion 451 is made into a substantially elliptical shape, the extension portion 452 is arranged on the minor axis AX2 side of the substantially elliptical shape, and as described above, the dimension D4 of the extension portion 452 in the width direction is made smaller than the inner diameter D2 of the clamp 20. By arranging the extension portion 452 in this way, even if a configuration is used in which the inner diameter D2 of the clamp 20 is smaller than the inner diameter D1 of the housing 10, the extension portion 452 can be arranged in a way of extending to the inside of the clamp 20 along the surface direction of the substrate 30, the extension portion 452 being connected to the minor axis AX2 side of the shield main body portion 451 having a substantially elliptical shape in a cross-sectional view (the side surface portion 451a side of the shield main body portion 451).

In the embodiment described above, the extension portion 452 has, but is not limited to, a flat plate shape extending along the surface direction of the substrate 30. That is, the extension portion 452 can be deformed into various other shapes as long as the extension portion 452 can extend to the inside of the clamp 20 and cover at least a portion of the circuit that is located inside the clamp 20.

The embodiment described above is for facilitating the understanding of the present invention, and not for interpreting the present invention in a limitative way. The flowchart, sequence, each element included in the embodiment, and the arrangement, material, condition, shape, size, and the like thereof, which are described in the embodiment, are not limited to those illustrated and can be appropriately changed. In addition, the configurations shown in different embodiments can be partially replaced or combined with each other.

APPENDIX 1

A proximity sensor (1), comprising:
a housing (10);
a coil portion that is accommodated in one end of the housing (10);
a clamp (20) that is connected to the other end of the housing (10);
a substrate (30) which is accommodated inside the housing (10) and the clamp (20), and on which a circuit electrically connected to the coil portion is mounted;
a shield (45) that covers a part of the substrate (30) located on a side of the housing (10); and
a sealing resin (R) which is arranged inside the housing (10) and the clamp (20), and covers at least a part of the substrate (30); wherein
the shield (45) has an extension portion (452) which extends to an inside of the clamp (20) and covers at least a part of the circuit located inside the clamp (20).

What is claimed is:

1. A proximity sensor, comprising:
a housing;
a coil portion that is accommodated in one end of the housing;
a clamp portion that is connected to the other end of the housing;
a substrate which is accommodated inside the housing and the clamp portion, and on which a circuit electrically connected to the coil portion is mounted;
a shield that covers a part of the substrate located on a side of the housing; and
a resin portion which is arranged inside the housing and the clamp portion, and covers at least a part of the substrate; wherein
the shield has an extension portion which extends to an inside of the clamp portion and covers at least a part of the circuit located inside the clamp portion; wherein
an inner diameter of the clamp portion is smaller than an inner diameter of the housing, and
the extension portion has a plate shape extending along a surface direction of the substrate, and a dimension in a width direction of the extension portion is smaller than the inner diameter of the clamp portion.

2. The proximity sensor according to claim 1, wherein the extension portion extends to a position that covers a part of the circuit on a side of the clamp portion.

3. The proximity sensor according to claim 2, wherein the shield comprises a shield main body portion which covers a part of the substrate located on the side of the housing, and the extension portion;
the shield main body portion has a cross-section in a substantially elliptical shape having a minor diameter smaller than an inner diameter of the clamp portion, and comprises a pair of side surface portions extending along a surface direction of the substrate, and a connection portion which connects the pair of side surface portions;
the side surface portion is arranged on a side of a minor axis of the substantially elliptical shape; and
the extension portion is a portion that extends from an end of the side surface portion to the inside of the clamp portion along the surface direction of the substrate.

4. The proximity sensor according to claim 1, wherein the shield comprises a shield main body portion which covers a part of the substrate located on the side of the housing, and the extension portion;
the shield main body portion has a cross-section in a substantially elliptical shape having a minor diameter smaller than an inner diameter of the clamp portion, and comprises a pair of side surface portions extending along a surface direction of the substrate, and a connection portion which connects the pair of side surface portions;
the side surface portion is arranged on a side of a minor axis of the substantially elliptical shape; and
the extension portion is a portion that extends from an end of the side surface portion to the inside of the clamp portion along the surface direction of the substrate.

* * * * *